(12) United States Patent
Krusor et al.

(10) Patent No.: US 10,147,702 B2
(45) Date of Patent: Dec. 4, 2018

(54) METHOD FOR SIMULTANEOUSLY BONDING MULTIPLE CHIPS OF DIFFERENT HEIGHTS ON FLEXIBLE SUBSTRATES USING ANISOTROPIC CONDUCTIVE FILM OR PASTE

(71) Applicant: Palo Alto Research Center Incorporated, Palo Alto, CA (US)

(72) Inventors: Brent S. Krusor, Fremont, CA (US); Ping Mei, San Jose, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 51 days.

(21) Appl. No.: 15/332,326

(22) Filed: Oct. 24, 2016

(65) Prior Publication Data

US 2018/0114772 A1 Apr. 26, 2018

(51) Int. Cl.
*H01L 23/00* (2006.01)

(52) U.S. Cl.
CPC .............. *H01L 24/97* (2013.01); *H01L 24/27* (2013.01); *H01L 24/743* (2013.01); *H01L 24/75* (2013.01);
(Continued)

(58) Field of Classification Search
CPC . H01L 2924/00014; H01L 2924/00012; H01L 2224/2731; H01L 2224/27848; H01L 2224/2929; H01L 2224/293; H01L 2224/75314; H01L 2224/83203; H01L 2224/83862; H01L 2224/97; H01L 2224/83; H01L 2224/27003; H01L 2224/27334; H01L 2224/2783; H01L 2224/29291; H01L 2224/75251; H01L 2224/75312; H01L 2224/75315; H01L 2224/75316; H01L 2224/75318; H01L 2224/7532; H01L 2224/75824; H01L 2224/7598; H01L 2224/83121; H01L 2224/83192; H01L 2224/83851; H01L 2224/95091; H01L 2224/95121; H01L 24/27; H01L 24/29; H01L 24/743; H01L 24/75; H01L 24/83; H01L 24/97
USPC ............... 156/291, 358, 412, 553, 580, 581
See application file for complete search history.

(56) References Cited

U.S. PATENT DOCUMENTS

| 5,353,498 A * | 10/1994 | Fillion ................. H01L 21/568 257/E21.505 |
| 6,221,691 B1 * | 4/2001 | Schrock ................ H01L 21/563 257/779 |

(Continued)

FOREIGN PATENT DOCUMENTS

| EP | 1 975 994 A1 | 10/2008 |
| EP | 2 413 676 A1 | 2/2012 |
| JP | 2003077953 | 3/2003 |

OTHER PUBLICATIONS http://finetechusa.com/bonders/products/fineplacerr-pico-ma.html—1 pg—accessed Oct. 19, 2016.
http://eu.finetech.de/micro-assembly/products/fineplacerr-pico-rna/fineplacerr-pico-ma-700n.html—1 pg accessed Oct. 19, 2016.
http://finetechusa.com/company/information/press/detail-view/finetech-unveils-high-force-acf-bonder.html—1 pg accessed Oct. 19, 2016.
EP Search Report 17197418.1-1212 dated Jul. 9, 2018.

*Primary Examiner* — Sonya M Sengupta
(74) *Attorney, Agent, or Firm* — Fay Sharpe LLP (57) ABSTRACT

The present application provides methods, systems and devices for simultaneously bonding multiple semiconductor chips of different height profiles on a flexible substrate.

17 Claims, 8 Drawing Sheets

(52) U.S. Cl.
CPC .............. *H01L 24/29* (2013.01); *H01L 24/83* (2013.01); *H01L 2224/27003* (2013.01); *H01L 2224/2731* (2013.01); *H01L 2224/2783* (2013.01); *H01L 2224/27334* (2013.01); *H01L 2224/27848* (2013.01); *H01L 2224/293* (2013.01); *H01L 2224/2929* (2013.01); *H01L 2224/29291* (2013.01); *H01L 2224/7532* (2013.01); *H01L 2224/7598* (2013.01); *H01L 2224/75251* (2013.01); *H01L 2224/75312* (2013.01); *H01L 2224/75314* (2013.01); *H01L 2224/75315* (2013.01); *H01L 2224/75316* (2013.01); *H01L 2224/75318* (2013.01); *H01L 2224/75824* (2013.01); *H01L 2224/83121* (2013.01); *H01L 2224/83192* (2013.01); *H01L 2224/83203* (2013.01); *H01L 2224/83851* (2013.01); *H01L 2224/83862* (2013.01); *H01L 2224/95091* (2013.01); *H01L 2224/95121* (2013.01); *H01L 2224/97* (2013.01)

(56) References Cited

U.S. PATENT DOCUMENTS

| | | | |
|---|---|---|---|
| 7,115,446 B2* | 10/2006 | Koo | H01L 21/563 438/125 |
| 7,884,719 B2* | 2/2011 | Oberle | G06K 19/07718 340/572.1 |
| 9,554,475 B2* | 1/2017 | Daniel | H05K 1/0283 |
| 2001/0053598 A1* | 12/2001 | Koyama | H01L 24/11 438/613 |
| 2002/0079594 A1* | 6/2002 | Sakurai | H01L 23/5387 257/778 |
| 2005/0282355 A1* | 12/2005 | Edwards | H01L 24/75 438/455 |
| 2007/0013067 A1* | 1/2007 | Nishida | H01L 21/563 257/737 |
| 2007/0259515 A1* | 11/2007 | Paik | H01L 21/561 438/612 |

* cited by examiner

METHOD FOR SIMULTANEOUSLY
BONDING MULTIPLE CHIPS OF
DIFFERENT HEIGHTS ON FLEXIBLE
SUBSTRATES USING ANISOTROPIC
CONDUCTIVE FILM OR PASTE

BACKGROUND

The present disclosure relates to packaging of electronic components, more particularly to the bonding of semiconductor chips to a flexible substrate.

Flexible hybrid electronics integrates packaged electronic components with high precision digital printing technologies on low cost flexible substrates and provides a cost-effective, large-area manufacturing technique while keeping the same complex functionality and processing capability as conventional integrated circuits. Various techniques have been developed for semiconductor chip integration on flexible substrates. In this process semiconductor chips are attached or bonded individually to conductive traces on the substrate. Bonding equipment consists of a metal thermode or hot bar supplying heat and pressure to bond a single semiconductor chip. However use of this technique does not allow for the attachment or bonding of multiple chips of arbitrary height in a dense configuration during the same attachment or bonding operation, i.e., the attachment or bonding does not take place in a substantially simultaneous manner. This restriction reduces the throughput for the semiconductor chip attachment or bonding step. Additionally, subsequent attachment or bonding of adjacent semiconductor chips can act to distort the thermally sensitive polymer substrate being used.

Therefore, it is considered desirable to develop a method, system and equipment to facilitate high density attachment of semiconductor chips having different heights substantially simultaneously.

BRIEF DESCRIPTION

The present application provides a method and system for simultaneously bonding multiple semiconductor chips of different height profiles on a flexible substrate. Such a method includes providing a flexible substrate with printed conductive traces. Placing an anisotropic conductive adhesive (ACA) over at least portions of the printed conductive traces of the flexible substrate, the ACA including a thermosetting adhesive and conductive spherical elements. Next the ACA is tacked in place by application of heat and pressure for a predetermined time. Thereafter a first side of each of multiple semiconductor chips is positioned to align with selected locations of the printed conductive traces of the flexible substrate lying under the ACA. At least one of the multiple semiconductor chips has a height profile different from at least one other one of the multiple semiconductor chips. Next there is a curing of the thermosetting adhesive of the ACA by applying heat and pressure. The pressure is also applied to a second side of each of the multiple semiconductor chips, and the applying of the pressure presses and deforms the conductive spherical elements of the ACA, wherein electrical contact is made between the semiconductor chips and at least portions of the printed conductive traces.

In another aspect the application of pressure occurs on a second side of each of the multiple semiconductor chips opposite the first side of each of the multiple semiconductor chips.

In another aspect applying the pressure includes using a pressure applying device having a deformable bonding head to provide the application of pressure to the second side of each of the multiple semiconductor chips, wherein the semiconductor chips of differing heights deform the deformable bonding head of the pressure applying device by different amounts of compression.

In another aspect the deformable bonding head is a rubber or other compliant material capable of withstanding a required bonding temperature and with a hardness to conform to the profiles of the semiconductor chips.

In another aspect the deformable bonding head is moved by at least one of a gas cylinder mechanism and a hydraulic mechanism.

In another aspect applying the pressure includes using a pressure applying device having an expandable elastic membrane to provide the application of pressure to the second side of each of the multiple semiconductor chips, wherein the expandable elastic membrane conforms to profiles of the semiconductor chips of differing heights that are to be bonded.

In another aspect applying the pressure includes using a pressure applying device having (i) a pin screen with a plurality of movable pins spaced apart from each other, each of the pins having a first end and a second end, (ii) a deformable elastic material located adjacent the first ends of the pins and second ends of the pins located at one of adjacent to and in contact with a second surface of each of the multiple semiconductor chips, and (iii) a pressure applicator which moves the pins into contact with the second side of each of the multiple semiconductor chips, wherein as the pins come into contact with the second side of each of the semiconductor chips the first ends of the corresponding pins deform the elastic plug.

In another aspect applying of pressure includes using a pressure applying device having (i) a pin screen with a plurality of movable pins spaced apart from each other, each of the pins having a first end and a second end, (ii) an expandable elastic membrane located adjacent the first ends of the pins and second end of the pins located at one of adjacent to and in contact with a second surface of each of the multiple semiconductor chips, and (iii) a pressure applicator which moves the pins towards or into contact with the second side of each of the multiple semiconductor chips, wherein as the pins come into contact with the second side of each of the semiconductor chips the first end of the corresponding pins deform the expandable elastic membrane.

The present application also discloses a semiconductor chip bonding device for bonding multiple semiconductor chips, at least one of the semiconductor chips having a height profile different from at least one other one of the multiple semiconductor chips. The device includes a heat generating element configured to hold a flexible substrate having printed conductive traces, the printed conductive traces at least partially covered by an anisotropic conductive adhesive. A semiconductor chip pick and place device is used to position a first side of each of the multiple semiconductor chips onto selected portions of the flexible substrate, wherein the semiconductor chip pick and place device is further configured to locate the semiconductor chips in an desired manner in relationship to the printed conductive traces. A pressure application arrangement includes a semiconductor chip engagement arrangement, wherein the pressure application arrangement is in an operational position sufficient to allow the semiconductor chip engagement arrangement to engage with a second surface of each of the semiconductor chips located on the flexible substrate, wherein at least one of the semiconductor chips has a height profile different from at least one other one of the multiple semiconductor chips.

In another aspect the semiconductor chip engagement element is a deformable bonding head, wherein the semiconductor chips of differing heights deform the deformable bonding head by different amounts of compression.

In another aspect there is a parallelism between the deformable bonding head and the flexible substrate (i.e., they are parallel to each other).

In another aspect the pressure application arrangement includes at least one of a gas cylinder mechanism and a hydraulic mechanism.

In another aspect the semiconductor chip engagement element is an expandable elastic membrane to which gas pressure is applied to provide the application of pressure to the second side of each of the multiple semiconductor chips, wherein the expandable elastic membrane conforms to the profiles of the semiconductor chips of different heights.

In another aspect the semiconductor chip engagement element includes (i) a pin screen with a plurality of movable pins spaced apart from each other, each of the pins having a first end and a second end, (ii) a deformable bonding head located adjacent the first ends of the pins, and the second end of the pins located at one of adjacent and in contact with a second surface of each of the multiple semiconductor chips, and (iii) a pressure applicator which moves the pins into contact with the second side of each of the multiple semiconductor chips, wherein as the pins come into contact with the second side of each of the semiconductor chips the first end of the corresponding pins deform the bonding head.

In another aspect the semiconductor chip engagement element includes (i) a pin screen with a plurality of movable pins spaced apart from each other, each of the pins having a first end and a second end, (ii) an expandable elastic membrane located adjacent the first ends of the pins and the second end of the pins located at one of adjacent and in contact with a second surface of each of the multiple semiconductor chips, and (iii) a pressure applicator which moves the pins towards or into contact with the second side of each of the multiple semiconductor chips, wherein as the pins come into contact with the second side of each of the semiconductor chips the first end of the corresponding pins the expandable elastic membrane.

In another aspect a fluoropolymer film is applied to a surface of the semiconductor chip engagement arrangement, to avoid a sticking of the bonding head to the semiconductor chips.

In another aspect a minimum height difference profile between at least two of the multiple semiconductor chips is 0.5 mm.

In another aspect a minimum height difference profile between at least two of the multiple semiconductor chips is 1.0 mm.

DETAILED DESCRIPTION

The present disclosure provides methods, systems and equipment to facilitate high density attachment or bonding of multiple semiconductor chips having different heights, where the attachment or bonding is done in a substantially simultaneous manner.

For thermal and mechanical reasons, traditional silicon integration methods such as solder bonding and wire bonding is not considered suitable for packaging hybrid electronics on flexible substrates. In consideration of this various packaging techniques have been developed for chip integration on flexible substrates including the use of anisotropic conductive adhesive (ACA), which can be embodied in a number of forms including but not limited to anisotropic conductive film (ACF) and anisotropic conductive paste (ACP). It is considered that until now attaching or bonding a plurality or multiple semiconductor chips of different heights in a dense configuration during the same attachment or bonding operation, such that the attachment or bonding is accomplished substantially simultaneously with ACA (such as in the form of ACF and/or ACP) has not been demonstrated.

Figure 1A:
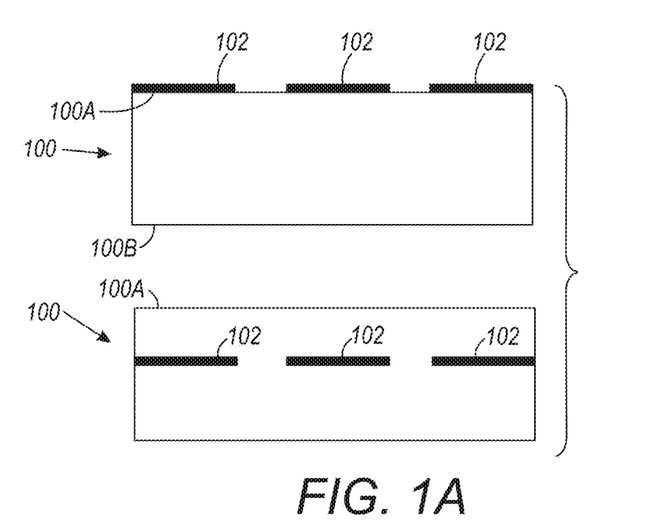
FIG. 1A illustrates side and top views of a flexible substrate having printed conductive traces.

The attachment or bonding operations of the present disclosure are now discussed in more detail. Initially, FIG. 1A shows a top and side view of a flexible substrate 100, having a upper surface 100A, and a lower surface 100B, including conductive traces 102, which are commonly applied by printing techniques. It is understood that other techniques may also be employed to obtain the conductive traces. Further the flexible substrate and conductive traces of FIG. 1A are depicted in a simplified form for convenience of discussion, and it is to be appreciated that the present concepts are applicable to much more complex designs and layouts as known in the art.

Figure 1B:
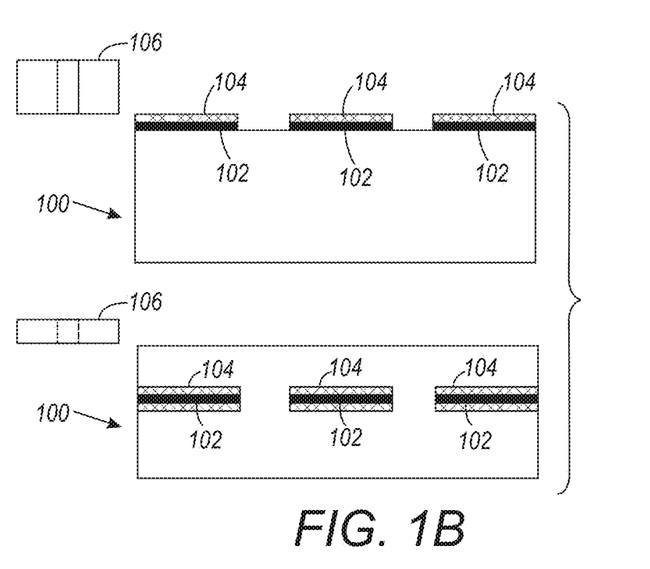
FIG. 1B illustrates side and top views of the substrate with conductive traces having anisotropic conductive adhesive located over at least the conductive traces.

Thereafter, as shown in top and side views of FIG. 1B, an anisotropic conductive adhesive (ACA) 104 is provided to cover at least some of the printed conductive traces 102. In certain embodiments the anisotropic conductive adhesive (ACA) is in the form of an anisotropic conductive film (ACF) or an anisotropic conductive paste (ACP). The application of the ACA in either form may be achieved by an adhesive dispenser 106 which is understood to be a film dispenser, paste dispenser, or other appropriate dispensing configuration.

Figure 1C:
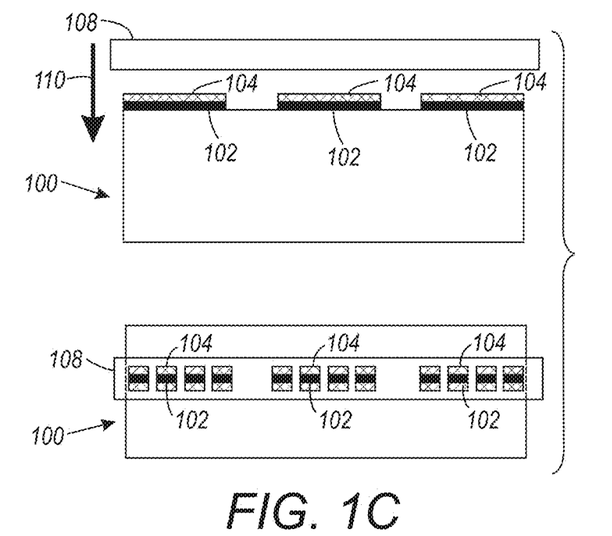
FIG. 1C illustrates side and top views of a pressure and heating element that is applied to the flexible substrate.

Thereafter, turning to top and side views of FIG. 1C, the ACA (e.g., tape, in one embodiment) is tacked into place by application of pressure and heat by heating/pressure element 108. In certain embodiments element 108 is a thermode or hot bar. In FIG. 1C, element 108 is configured to move in the direction of arrow 110 moves down to the surface 100A of the flexible substrate 100 and may come into contact with the material on its surface. The heat and pressure may be applied for a determined time, such as a few seconds (in one embodiment 1-3 seconds, where 3-5 seconds is typical) to obtain the tacking state for the anisotropic conductive adhesive. The elements 102, 104 are shown in the bottom Figure of 1C as dashed to note the view is from under element 108.

When the anisotropic conductive adhesive is in the form of an anisotropic conductive tape (ACT), it will commonly have a non-sticking liner on its outer upper surface. Following the tacking operation, this liner may be removed.

Figure 1D:
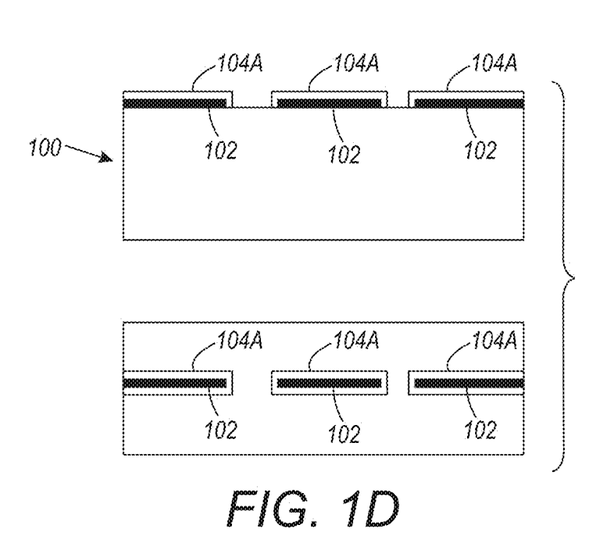
FIG. 1D illustrates side and top views of the flexible substrate wherein the ACA has a tacked path for the conductive traces.

Turning now to the top and side views of FIG. 1D, the flexible substrate 100 is shown with the conductive traces 102 covered by the anisotropic conductive adhesive (ACA) 104 in a tacky state 104A.

Figure 1E:
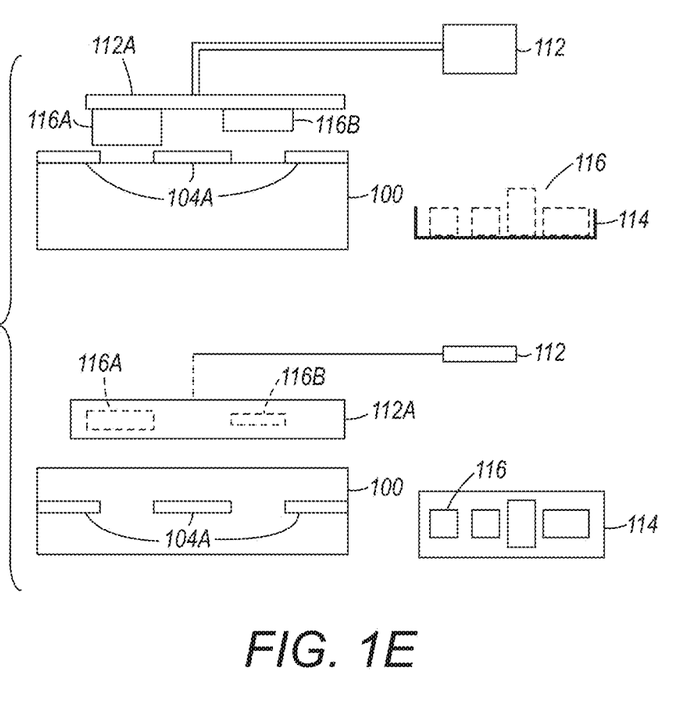
FIG. 1E illustrates side and top views of the placement of semiconductor chips on the flexible substrate of the present application.

Thereafter and with attention to top and side views of FIG. 1E shown is a semiconductor chip pick and place device 112 operating in cooperation with a semiconductor chip holding area 114 having a plurality of semiconductor chips 116A and 116B. The pick and place device 112 selects one or more semiconductor chips 116 and thereafter moves such selected chips to the flexible substrate 100. The semiconductor chips 116A and 116B are positioned and oriented by the pick and place device 112 so that they are registered, i.e., properly positioned with selected areas of the conductive printed traces 102, where the traces lie under the tacky anisotropic conductive adhesive 104A.

More particularly, with regard to FIG. 1E pick and place device 112 is shown with a carrying element 112A carrying two semiconductor chips 116A and 116B, which are positioned such that the semiconductor chips 116A, 116B will be placed to bridge areas of the conductive traces (not shown) covered by the ACA in a tacky state. FIG. 1E depicts the semiconductor chips 116A and 116B having different height profiles.

It is noted that the illustrations of FIG. 1E show the pick and place device placing two semiconductor chips at the same time, in certain embodiments only a single semiconductor chip is picked and placed at a time. While in other embodiments multiple semiconductor chips are picked and placed at the same time. It is also to be appreciated that it is common for more than a single pick and place device to be used in populating a flexible substrate.

At this point it is illustrated that semiconductor chips 116A, 116B having distinctly different height profiles are positioned on the upper surface 100A of the flexible substrate 100. As noted regarding existing processes and systems, attachment and/or bonding of these semiconductor chips would be undertaken one at a time due to the height differences, and therefore a substantially simultaneous attachment or bonding operation would not be achieved, slowing down the packaging operations.

Figure 2:
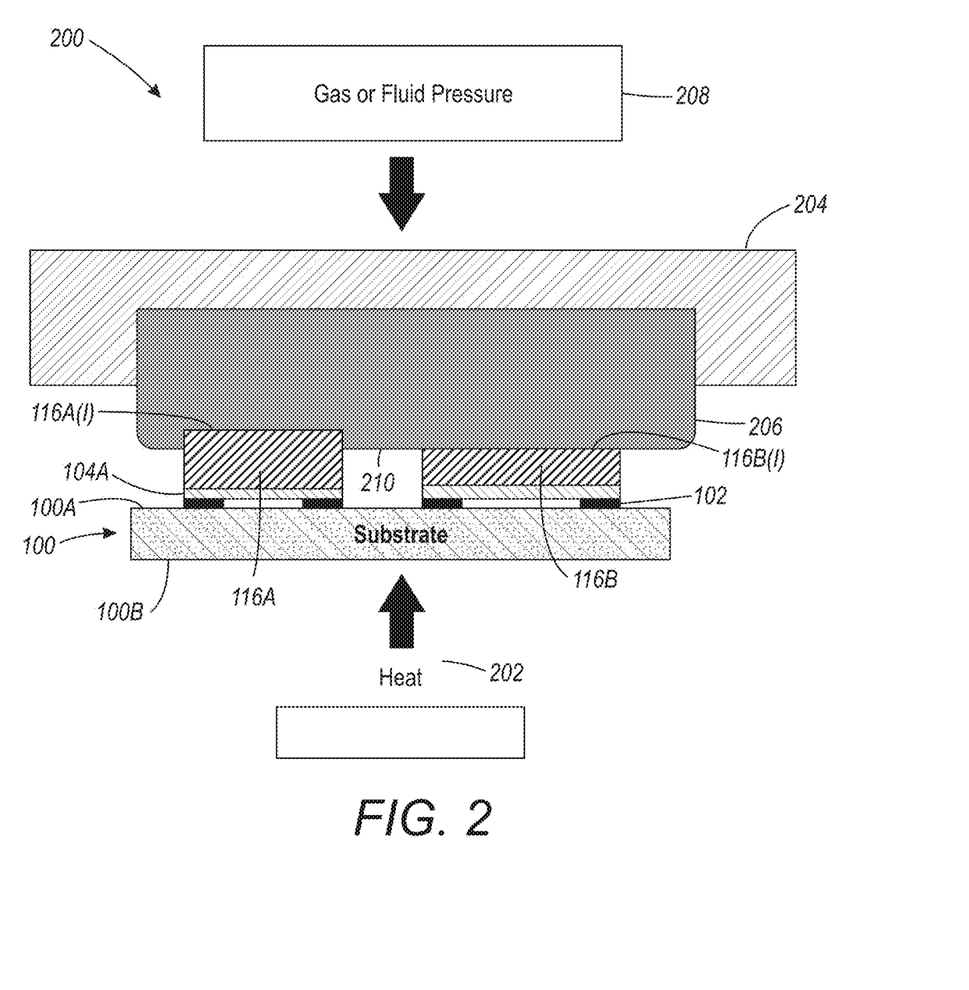
FIG. 2 illustrates a first embodiment of an attachment or bonding device according to the present application.

Turning to FIG. 2, depicted is a side view of an attachment or bonding device 200 designed to bond multiple chips of different heights in a dense configuration. The device 200 is being shown in use with the previously illustrated arrangement which includes the flexible substrate 100, which has the conductive traces 102 covered by the ACA (e.g., in certain embodiments being an ACF and/or ACP) 104 (in a tacky state 104A) and which carries semiconductor chips of differing heights 116A, 116B. With attention to the device 200, the arrangement is in operational arrangement with heater (e.g., a heated platen) 202 positioned adjacent the second surface 100B of the flexible substrate 100. The attachment or bonding device 200 further includes a support member 204 to which is attached a bonding head (also called herein compliant plug, of rubber or other polymer) 206. A movement element (which may be in the form of an gas (e.g., air) cylinder mechanism, hydraulic mechanism, or other appropriate motivating arrangement) 208 is in operational position to move the support member 204 and therefore the bonding head 206 into association with upper surface 116A(i) of semiconductor chip 116A and an upper surface 116B(i) of semiconductor chip 116B. As the movement element 208 is activated to move the support member 204 and bonding head 206 into contact with the semiconductor chips 116A, 116B, heat from the heated platen 202 and pressure from the upper portion of the attachment or bonding device 200 apply heat and pressure, thereby curing the thermosetting adhesive of the ACA while simultaneously pressing and deforming spherical elements (conductive balls) and at substantially the same time curing of the thermosetting adhesive is taking place.

These substantially simultaneous or overlapping actions which press and deform the spherical elements allow for an electrical contact to be made in the z-direction (i.e., between the conductive traces 102, and the semiconductor chips 116A and 116B). As can be seen in FIG. 2, there is a strong parallelism between the flexible substrate 100 and the bonding head 206. This is important in order to provide an even amount of pressure on the semiconductor chips.

An appropriate force factor for the movement element (i.e., in the form of an air cylinder or hydraulic cylinder) 208 allows for the use of standard levels of air pressure and/or hydraulic pressure to achieve very large forces on the semiconductor chips. The force factor will depend on the pressure that needs to be applied and that is proportional to the total area of the semiconductor chips being bonded. A typical upper level of useful air pressure is about 80 psi. In an experiment an air cylinder with a force factor of 3 (which gives a maximum applied pressure of 240 psi) was used. This can be increased if a large number of chips are being bonded.

A fluoropolymer film 210 is, in certain embodiments, applied to the surface of the bonding head 206 to diminish or prevent sticking of the semiconductor chips 116A, 116B to the bonding head 206 when the pressure is removed.

It is to be appreciated the tacky ACA 104A of FIG. 2 is shown extending across a gap between traces 102. This is provided as one possibility if the tackiness has a sufficient stiffness. In other embodiments, the tacky ACA would encompass the semiconductor chips but not the gap area (similar concepts are also appropriate for FIGS. 3, 4, and 5).

With continuing attention to FIG. 2, a particular aspect of attachment or bonding device 200 is that the bonding head 206 is compliant and allows for deformation when downward pressure is applied causing a meeting with the top surfaces 116A, 116B. This can be seen in FIG. 2, where the semiconductor chip 116A acts to deform the bonding head to a greater degree than the semiconductor chip 116B which has a lower height profile than semiconductor chip 116A.

While not restricted to any particular material, in one embodiment, a neoprene rubber may be used as the bonding head (i.e., compliant plug) 206. With regard to neoprene rubber, in a particular embodiment, a material of 40A hardness was found to be useful for the present operation. It is understood that a softer rubber would tend to be more useful when there is a greater disparity in height of the semiconductor chips being bonded. For a large enough disparity in height there will be significant differences in the compressive force being applied to different height chips because of the difference in the amount of compression of the rubber over each chip.

Figure 3:
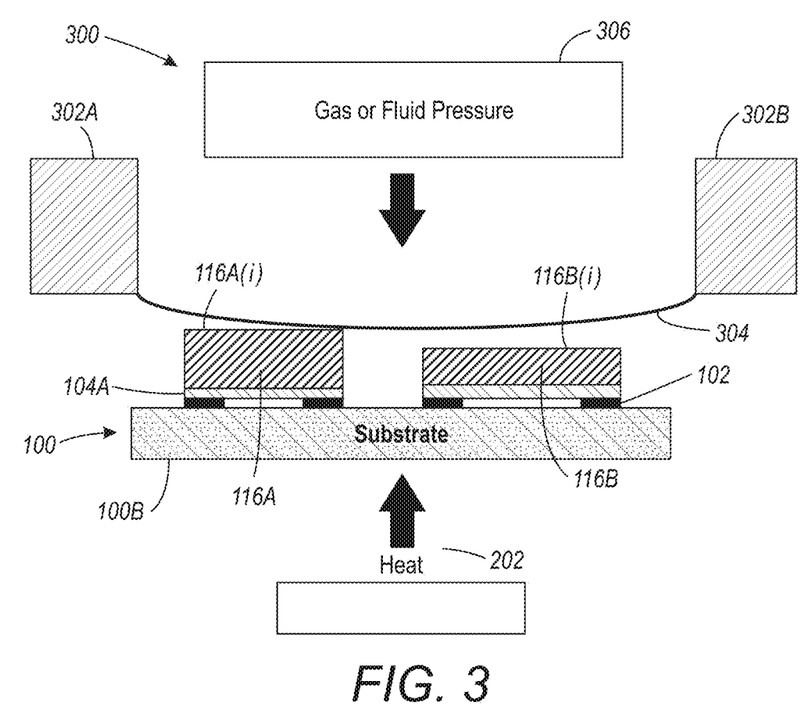
FIG. 3 illustrates an alternative design of a multiple chip attachment or bonding device.

Turning to FIG. 3, illustrated is an alternative multiple semiconductor chip attachment or bonding device 300. While the materials on the flexible substrate 100 are similar to those discussed in connection with FIG. 2 as well as the flexible substrate 100 being operationally associated with a heated platen 202, the pressure providing mechanism for the top of the semiconductor chips 116A and 116B is implemented in a different manner. More particularly, support members 302A, 302B hold an expandable elastic membrane 304 which, in certain embodiments, may be, but is not limited to approximately ⅛ inch thick.

Also shown in attachment or bonding device 300 is a movement element 306 similar to that discussed in connection with FIG. 2. However, the actual implementation may be slightly different as the pressure is being applied to the expandable elastic membrane 304 rather than to a non-flexible support member or carrier (e.g., 204 of FIG. 2).

The arrangement to move the expandable elastic membrane 304 may be a gas (e.g., air) cylinder mechanism, a hydraulic mechanism, or other appropriate motivating arrangement. More particularly, this motivating force (gas pressure or fluid pressure) is directly applied to the expandable elastic membrane 304 which pushes the membrane down and causes it to conform to the profiles of the semiconductor chips to be attached or bonded. Similar to the concepts in FIG. 2, for the taller semiconductor chip 106a, there will be more of an impediment to the movement of the expandable elastic membrane 304 downward. However, each semiconductor chip will engage with the expandable elastic membrane 304. By this arrangement heat and pressure is thereby applied to the flexible substrate arrangement 100 resulting in an attachment or bonding of the semiconductor chips 116A and 116B.

Figure 4:
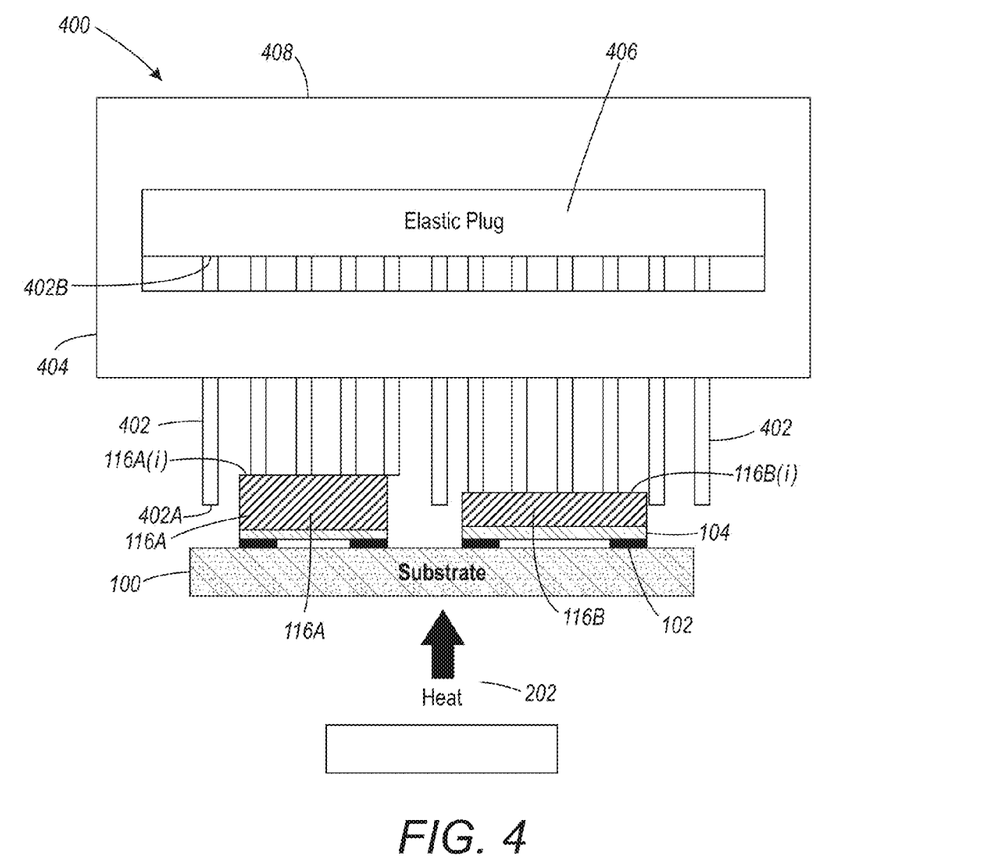
FIG. 4 illustrates another embodiment of an attachment or bonding device.

Turning to FIG. 4, illustrated is a further embodiment of an attachment or bonding device 400. In this embodiment, a flexible substrate 100 and associated elements previously discussed (e.g., conductive traces 102, tacky ACA 104A, semiconductor chips 116A, 116B) are provided as in the previous discussions. Similarly, a heated platen 202 such as in the previous embodiments is also provided. Distinguishing characteristics of attachment or bonding device 400 is in the use of a plurality of pins held in a support structure (e.g., a pin screen) 404 in a manner that allows the pins to move transversely back and forth, particularly when pressure is applied at ends 402A of pins 402. In other words, as pressure is applied at the pin ends 402A, the pins will move away from the pressure. The pins are substantially equivalently spaced although in certain embodiments, if it is desired, the pins might be grouped in different arrangements. At an opposite end 402B of the pins 402, an elastic plug 406 is provided (in certain embodiments made of a rubber or other polymer).

These components are arranged in a carrying mechanism 408 which is movable. As the carrying mechanism 408 moves downward towards the top surfaces of semiconductor chips 116A, 116B, the pin ends 402A come into contact with the top surfaces of the semiconductor chips 116A, 116B. This causes the pins 402 to be pushed back into the elastic plug 406. The deformability and strength of the elastic plug 406 is selected such that sufficient pressure is provided on the top surface of the semiconductor chips 116A, 116B that as heat is supplied by heater (e.g., heat platen) 202, the bonding of the chips take place in a substantially simulta-neous manner, even though semiconductor chips 116A and 116B have different height profiles.

Figure 5:
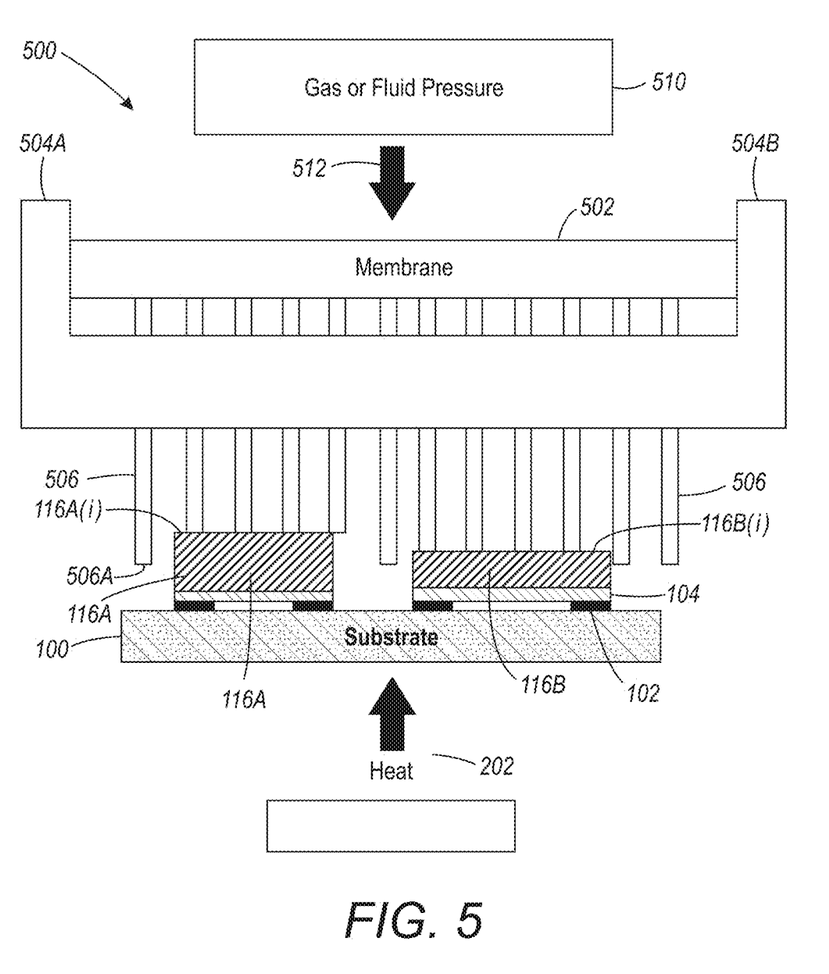
FIG. 5 illustrates another embodiment of an attachment or bonding device.

Turning to FIG. 5, depicted is yet another embodiment using the pin screen type structure. The attachment or bonding device 500 again is similarly arranged to operate with the previously discussed flexible substrate 100, conductive traces 102, tacky ACA 104A, and semiconductor chips 116A, 116B. Again, a heated platen 202 is provided on a bottom side surface of the flexible substrate 100. In this design, instead of the elastic plug or bonding head 406 of FIG. 4, an elastic membrane 502 is provided which is secured at ends 504A, 504B. The pins 506 again arranged to be securely movable within a holding region 508, being able to translate movement depending on pressure applied to the tips 506A of pins 506. In this embodiment, a gas (e.g., air), hydraulic or other appropriate source of pressure 510 is provided on one side of membrane 502. As the pressure (such as similarly discussed in connection with the previous embodiments) is applied causing the membrane to move in a downward direction, such as by arrow 512, the pins move into contact with the upper surfaces of semiconductor chips 116A, 116B and the membrane 502 supplies the pressure to the semiconductor chips 116A, 116B such that pressure and heat are sufficient to perform the attachment or bonding process in a simultaneous manner.

Figure 6A:
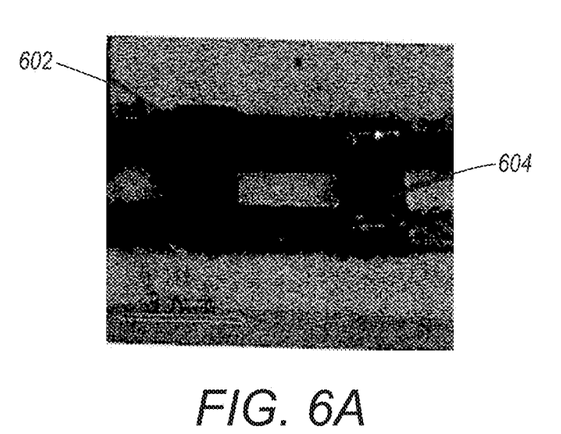
FIG. 6A illustrates two different semiconductor chips having distinct height components bonded by the simultaneous bonding operations of the present application.

Turning to FIG. 6A, illustrated are two semiconductor chips (e.g., resistors) having two different height components such as semiconductor chip 69 being 1.75 mm and semiconductor chip 604 being 0.6 mm. These chips have been bonded with the use of ACF to conductive traces as discussed in the previous examples. In other words, they have been bonded in a simultaneous bonding operation even though they have significant different height components.

Figure 6B:
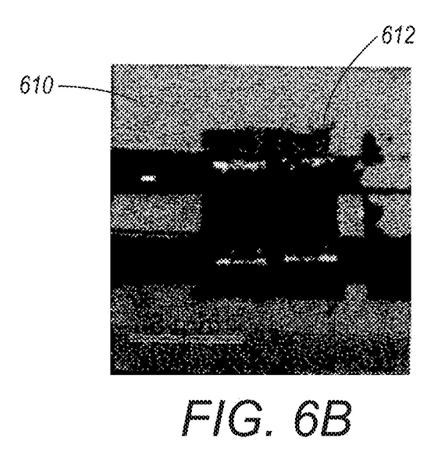
FIG. 6B illustrates two resistors mounted according to the present application in a side-by-side highly dense manner.

FIG. 6B illustrates two resistors 610, 612 bound side-by-side in a high density close proximity configuration using the concepts of the present application. It is understood that the present application teaches methods and processed as well as systems and devices that allow for a substantially simultaneous bonding for attachment of semiconductor chips having intentionally different distinct height profiles. This is an aspect which is particularly suitable for packing of hybrid electronics on flexible substrates.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method for substantially simultaneously bonding multiple semiconductor chips of different height profiles on a flexible substrate comprising:

providing a flexible substrate with printed conductive traces;

placing an anisotropic conductive adhesive (ACA) over at least portions of the printed conductive traces of the flexible substrate, the ACA including a thermosetting adhesive and conductive spherical elements;

tacking the ACA in place by application of heat and pressure for a predetermined time by use of a heat generating mechanism and a pressure generating mechanism;

positioning and orientating a first side of each of multiple semiconductor chips to align with selected locations of the printed conductive traces of the flexible substrate lying under the ACA by use of a positioning and orienting mechanism, wherein at least one of the multiple semiconductor chips has a height profile different from at least one other one of the multiple semiconductor chips; and curing the thermosetting adhesive of the ACA by applying heat and pressure by use of a curing mechanism, wherein the pressure is applied to a second side of each of the multiple semiconductor chips, the applying of the pressure pressing and deforming the conductive spherical elements of the ACA, wherein electrical contact is made between the semiconductor chips and at least portions of the printed conductive traces;

wherein applying the pressure includes using a pressure applying device having (i) a pin screen with a plurality of movable pins spaced apart from each other, each of the pins having a first end and a second end, (ii) a deformable elastic plug located adjacent the first ends of the pins and second ends of the pins located adjacent to or in contact with the second side of each of the multiple semiconductor chips, and (iii) a pressure applicator which moves the pins into contact with the second side of each of the multiple semiconductor chips, wherein as the pins come into contact with the second side of each of the semiconductor chips, the first ends of the corresponding pins deform the elastic plug.

2. The method according to claim 1 wherein the application of pressure occurs on the second side of each of the multiple semiconductor chips opposite the first side of each of the multiple semiconductor chips.

3. The method according to claim 1 wherein the pressure applying device has a deformable bonding head to provide the application of pressure to the second side of each of the multiple semiconductor chips, wherein the semiconductor chips of differing heights deform the deformable bonding head of the pressure applying device by different amounts of compression.

4. The method according to claim 3 wherein the deformable bonding head is a rubber or other compliant material capable of withstanding a required bonding temperature and with a hardness to conform to the profiles of the semiconductor chips.

5. The method according to claim 3 further including moving the deformable bonding head by at least one of a gas cylinder mechanism and a hydraulic mechanism.

6. A semiconductor chip bonding device for bonding multiple semiconductor chips, at least one of the semiconductor chips having a height profile different from at least one other one of the multiple semiconductor chips comprising:

a heat generating element configured to hold a flexible substrate having printed conductive traces, the printed conductive traces at least partially covered by an anisotropic conductive adhesive;

a semiconductor chip pick and place device configured to position a first side of each of the multiple semiconductor chips onto selected portions of the flexible substrate, wherein the semiconductor chip pick and place device is further configured to locate the semiconductor chips in a desired manner in relationship to the printed conductive traces; and a pressure application arrangement including a semiconductor chip engagement arrangement, wherein the pressure application arrangement is in an operational position sufficient to allow the semiconductor chip engagement arrangement to engage with a second side of each of the semiconductor chips located on the flexible substrate, wherein at least one of the semiconductor chips has a height profile different from at least one other one of the multiple semiconductor chips;

wherein the semiconductor chip engagement arrangement includes (i) a pin screen with a plurality of movable pins spaced apart from each other, each of the pins having a first end and a second end, (ii) an expandable elastic membrane located adjacent the first ends of the pins and the second end of the pins located adjacent to or in contact with the second side of each of the multiple semiconductor chips, and (iii) a pressure applicator which moves the pins towards or into contact with the second side of each of the multiple semiconductor chips, wherein the expandable elastic membrane is configured such that as the pins come into contact with the second side of each of the semiconductor chips, the first end of the corresponding pins expand the expandable elastic membrane.

7. The device according to claim 6 wherein the semiconductor chip engagement arrangement is a deformable bonding head, wherein the semiconductor chips of differing heights deform the deformable bonding head by different amounts of compression.

8. The device according to claim 7 wherein there is a parallelism between the deformable bonding head and the flexible substrate.

9. The device according to claim 6 wherein the pressure application arrangement includes at least one of a gas cylinder mechanism and a hydraulic mechanism.

10. The device according to claim 6 wherein gas pressure is applied to the expandable elastic membrane to provide the application of pressure to the second side of each of the multiple semiconductor chips, wherein the expandable elastic membrane conforms to the profiles of the semiconductor chips of different heights.

11. The device according to claim 6 further including a fluoropolymer film applied to a surface of the semiconductor chip engagement arrangement, to avoid a sticking of the bonding head to the semiconductor chips.

12. The device according to claim 6 wherein a minimum height difference profile between at least two of the multiple semiconductor chips is 0.5 mm.

13. The device according to claim 6 wherein a minimum height difference profile between at least two of the multiple semiconductor chips is 1.0 mm.

14. A system for bonding multiple semiconductor chips of different heights on a flexible substrate comprising:

a flexible substrate with printed conductive traces;

an anisotropic conductive adhesive (ACA) placed over at least portions of the printed conductive traces of the flexible substrate, the ACA including a thermosetting adhesive and conductive spherical elements;

a heat generating mechanism;

a pressure generating mechanism, wherein the ACA is tacked in place by application of heat by the heat mechanism and by application of pressure by the pressure mechanism for a predetermined time;

a positioning and orientating mechanism to hold a first side of at least one of each of multiple semiconductor chips to register and place the held semiconductor chips with selected locations of the underlying printed conductive traces of the flexible substrate; and a curing mechanism to cure the thermosetting adhesive of the ACA by application of heat and pressure, wherein the pressure is applied to a second side of each of the multiple semiconductor chips, the application of the pressure substantially simultaneously pressing and deforming the conductive spherical elements of the ACA, wherein electrical contact is made between the semiconductor chips and at least portions of the printed conductive traces;

wherein:

the curing mechanism includes: (i) a pin screen with a plurality of movable pins spaced apart from each other, each of the pins having a first end and a second end, and (ii) a deformable elastic plug located adjacent the first ends of the pins and second ends of the pins located adjacent to or in contact with the second side of each of the multiple semiconductor chips;

the pressure generating mechanism is configured to move the pins into contact with the second side of each of the multiple semiconductor chips; and the curing mechanism is configured such that as the pins come into contact with the second side of each of the semiconductor chips, the first ends of the corresponding pins deform the elastic plug.

15. The system of claim 14, wherein the deformable elastic plug is made of rubber.

16. The system of claim 14, wherein at least three pins of the pin screen contact at least one of the semiconductor chips of the multiple semiconductor chips.

17. The system of claim 14, wherein:

the heat generating mechanism is configured to apply heat to the first side of each of the multiple semiconductor chips through the flexible substrate; and the first side of each of the multiple semiconductor chips is opposite to the second side of each of the multiple semiconductor chips.

* * * * *